United States Patent
Chang

(10) Patent No.: US 7,440,532 B1
(45) Date of Patent: Oct. 21, 2008

(54) BIT SLIP CIRCUITRY FOR SERIAL DATA SIGNALS

(75) Inventor: Richard Yen-Hsiang Chang, Bloomfield, NJ (US)

(73) Assignee: Altera Corporation, San Jose, CA (US)

( * ) Notice: Subject to any disclaimer, the term of this patent is extended or adjusted under 35 U.S.C. 154(b) by 892 days.

(21) Appl. No.: 10/830,277

(22) Filed: Apr. 21, 2004

(51) Int. Cl.
 *H04L 25/00* (2006.01)
(52) U.S. Cl. .......................... 375/372; 375/377; 711/109
(58) Field of Classification Search .................. 375/354, 375/372, 377; 711/109; 371/100, 101
 See application file for complete search history.

(56) References Cited

U.S. PATENT DOCUMENTS

| | | | |
|---|---|---|---|
| 4,429,300 A * | 1/1984 | Yamasawa et al. ........... 341/100 |
| 5,081,654 A | 1/1992 | Stephenson, Jr. et al. | |
| 5,426,784 A * | 6/1995 | Kawata et al. .............. 713/600 |
| 5,625,825 A | 4/1997 | Rostoker et al. | |
| 5,633,608 A * | 5/1997 | Danger ....................... 327/270 |
| 5,757,353 A | 5/1998 | Yokota et al. | |
| 5,832,047 A | 11/1998 | Ferraiolo et al. | |
| 5,909,206 A | 6/1999 | Yokota et al. | |
| 6,192,482 B1 | 2/2001 | Casper et al. | |
| 6,611,217 B2 | 8/2003 | Buchanan et al. | |
| 6,650,140 B2 | 11/2003 | Lee et al. ...................... 326/39 |
| 6,650,661 B1 | 11/2003 | Buchanan et al. | |
| 6,724,328 B1 | 4/2004 | Lui et al. ..................... 341/101 |
| 6,963,223 B2 | 11/2005 | Venkata et al. | |
| 2001/0033188 A1 | 10/2001 | Aung et al. ................. 327/141 |
| 2002/0159483 A1 | 10/2002 | Clauberg | |
| 2003/0123450 A1 | 7/2003 | Wright et al. | |
| 2004/0160509 A1 | 8/2004 | Nihei et al. | |
| 2005/0129070 A1 | 6/2005 | Panikkar et al. | |
| 2005/0175072 A1 | 8/2005 | Mack et al. | |
| 2005/0231399 A1 | 10/2005 | Fowler et al. | |

FOREIGN PATENT DOCUMENTS

| | | |
|---|---|---|
| JP | 54-053840 | 4/1979 |
| JP | 61-214024 | 9/1986 |

(Continued)

OTHER PUBLICATIONS

U.S. Appl. No. 10/059,014, filed Jan. 29, 2002, Lee et al.

(Continued)

*Primary Examiner*—Dac V Ha
(74) *Attorney, Agent, or Firm*—Ropes & Gray LLP; Jeffrey H. Ingerman; Chia-Hao La

(57) ABSTRACT

Circuitry for use in aligning bytes in a serial data signal (e.g., with deserializer circuitry that operates in part in response to a byte rate clock signal) includes a multistage shift register for shifting the serial data signal through a number of stages at least equal to (and in many cases, preferably more than) the number of bits in a byte. The output signal of any shift register stage can be selected as the output of the "bit slipping" circuitry so that any number of bits over a fairly wide range can be "slipped" to produce or help produce appropriately aligned bytes. The disclosed bit slipping circuitry is alternatively or additionally usable in helping to align ("deskew") two or more serial data signals that are received via separate communication channels.

42 Claims, 1 Drawing Sheet

FOREIGN PATENT DOCUMENTS

| JP | 61-264842 | 11/1986 |
| JP | 62-151029 | 7/1987 |
| JP | 02-223246 | 9/1990 |
| JP | 09-082034 | 3/1997 |
| JP | 2000-216744 | 8/2000 |

OTHER PUBLICATIONS

U.S. Appl. No. 10/317,262, filed Dec. 10, 2002, Venkata et al.
U.S. Appl. No. 10/349,541, filed Jun. 3, 2003, Venkata et al.
U.S. Appl. No. 10/637,982, filed Aug. 8, 2003, Venkata et al.
U.S. Appl. No. 10/668,900, filed Sep. 22, 2003, Asaduzzaman et al.
U.S. Appl. No. 10/672,901, filed Sep. 26, 2003, Asaduzzaman et al.
J. H. Day, "Chips, Modules Target OC-192," *Electronic Engineering Times*, n. 1159, pp. 129, 2001.
G. M. Jacobs, et al., "A Fully Asynchronous Digital Signal Processor Using Self-Timed Circuits," *IEEE Journal of Solid-State Circuits*, vol. 25, No. 6, pp. 1526-1537, Dec. 1990.
D. T. Kong, "2.488 Gb/s SONET Multiplexer/Demultiplexer with Frame Detection Capability," *IEEE Journal on Selected Areas in Communications*, vol. 9, No. 5, pp. 726-731, Jun. 1991.
M. Pauwels, et al., "Type-Handling in Bit-True Silicon Compilation for DSP," *IMEC Leuven*, Belgium, pp. 166-170, Sep. 1989.
K. Schoofs, et al., "Bit-Alignment in Hardware Allocation for Mulitplexed DSP Architectures," *IEEE*, 1993, pp. 289-293.

* cited by examiner

BIT SLIP CIRCUITRY FOR SERIAL DATA SIGNALS

BACKGROUND OF THE INVENTION

This invention relates to circuitry for handling serial data signals.

Circuitry that receives a serial data signal may need to perform various alignment tasks on that signal to render it more suitable for further processing. For example, a received serial data signal may include successive "bytes" of data (each including a predetermined number of successive bits) with no accompanying synchronization signal to tell the receiver circuitry where the byte boundaries are in the serial data. The receiver circuitry may deserialize the incoming data, and then test for proper bytes in the deserialized data. If proper bytes are not found when the serial data is deserialized in a particular way (i.e., assuming a particular "trial" byte boundary location), then different trial byte boundary locations are tried until proper bytes are found. The successful trial byte boundary location becomes the final byte boundary location, which is used for subsequent deserialization of the serial data.

Known byte alignment techniques include (1) clock stalling and (2) multiple multiplexer control. Both of these techniques may involve use of deserializer circuitry that shifts an incoming serial data signal into a shift register at the serial data bit rate, and periodically outputs the contents of the shift register in parallel at a byte rate (the byte rate being the bit rate divided by the number of bits in a byte). The clock stalling technique involves disabling the counter that converts the bit rate to the byte rate for one serial clock signal cycle. This causes the parallel output of the deserializer to shift ("slip") one bit. The multiplexer control technique involves supplying the deserializer output signals to several different multiplexers and controlling the multiplexers to select different ones of their inputs until the selection causes the multiplexer outputs to collectively constitute a proper byte. Again, each successive trial multiplexer control selection typically causes the parallel output to shift or slip one bit.

Another example of a serial data signal alignment task that may need to be performed is "channel-to-channel" alignment to compensate for "skew" (loss of synchronization) between two or more serial data streams that are received via separate, parallel channels. Bit slipping may also be useful in performing such channel-to-channel alignment.

The known bit slipping techniques mentioned above may have certain disadvantages, such as relatively large size and limited numbers of bits that they can "slip" in an effort to do byte alignment and/or channel-to-channel alignment.

SUMMARY OF THE INVENTION

Bit slip circuitry in accordance with the present invention includes multistage shift register circuitry, through which a serial data input signal is shifted, and selection circuitry for selecting a serial data output signal from among the output signals of at least some stages of the shift register circuitry. By selecting the output signal from different shift register stage outputs, different amounts of shift or slip of the output signal relative to the input signal can be achieved.

The selection circuitry may be implemented as multiplexer circuitry. Each input to the multiplexer circuitry may be a respective one of the shift register stage outputs. Counter circuitry may be used to control the selection made by the multiplexer circuitry. The counter circuitry may be adapted to selectively count pulses that are at the bit rate of the serial data input signal. Various other counter controls may be employed (e.g., the counter may selectively restart its count after reaching a limiting count, which may be controllably selectable). The shift register preferably has at least approximately as many stages as there are bits in each byte in the serial data input signal. In some instances it is more preferable for the shift register to have substantially more stages than there are bits in a byte.

Further features of the invention, its nature and various advantages will be more apparent from the accompanying drawing and the following detailed description.

DETAILED DESCRIPTION

Figure 1:
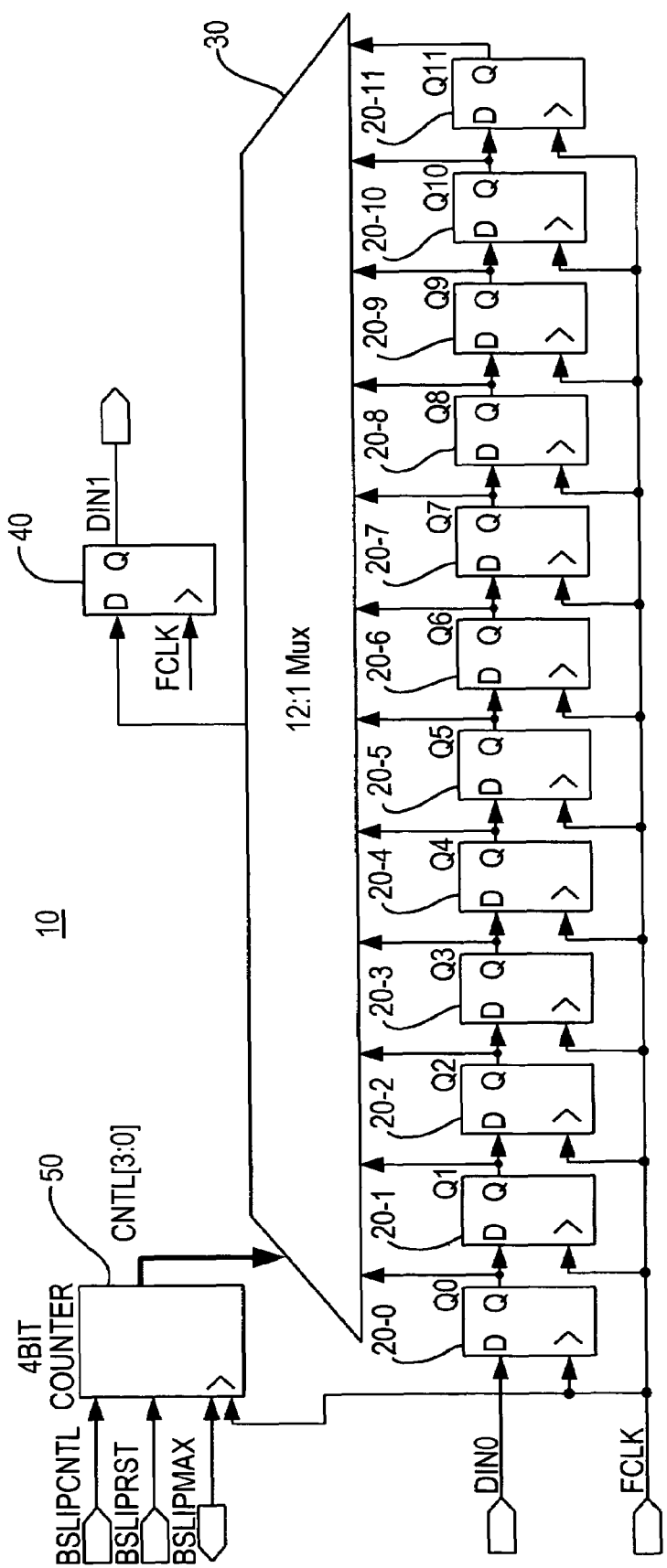
FIG. 1 is a simplified schematic block diagram of an illustrative embodiment of circuitry constructed in accordance with the invention.

As shown in FIG. 1, illustrative circuitry 10 in accordance with the invention includes a plurality of register or flip-flop circuits 20-0 through 20-11 connected in a series or chain so that the data output Q of each flip-flop is the data input D to the subsequent flip-flop in the chain. The serial data signal DIN0 received by the circuitry is applied to the D input of the first register 20-0 in the chain, and all of registers 20 are clocked by the same clock signal FCLK, which is at the bit rate of the DIN0 signal. For example, in a situation in which clock data recovery ("CDR") has been used, DIN0 may be a retimed data signal output by the CDR circuitry and FCLK may be the recovered clock signal output by that circuitry. (Examples of CDR circuitry are shown in Aung et al. U.S. patent application Ser. No. 09/805,843, filed Mar. 13, 2001, Lee et al. U.S. patent application Ser. No. 10/059,014, filed Jan. 29, 2002, Lee et al. U.S. Pat. No. 6,650,140, Venkata et al. U.S. patent application Ser. No. 10/195,229, filed Jul. 11, 2002, Venkata et al. U.S. patent application Ser. No. 10/273,899, filed Oct. 16, 2002, Venkata et al. U.S. patent application Ser. No. 10/317,262, filed Dec. 10, 2002, Lui et al. U.S. patent application Ser. No. 10/454,626, filed Jun. 3, 2003, Venkata et al. U.S. patent application Ser. No. 10/349,541, filed Jan. 21, 2003, Venkata et al. U.S. patent application Ser. No. 10/637,982, filed Aug. 8, 2003, Asaduzzaman et al. U.S. patent application Ser. No. 10/668,900, filed Sep. 22, 2003, and Asaduzzaman et al. U.S. patent application Ser. No. 10/672,901, filed Sep. 26, 2003. These references also illustrate contexts in which concepts like those dealt with herein (e.g., bit slipping, byte alignment, channel-to-channel alignment, etc.) are employed. Thus these references show examples of larger circuitry that can be modified to make use of circuitry of the type shown herein.)

From the foregoing it will be apparent that registers 20 operate like a shift register to shift in successive bits of the DIN0 signal in synchronism with the serial bit rate FCLK signal. Thus, at any one time, registers 20 collectively contain and output the 12 most recent bits in the incoming serial data signal DIN0, with the oldest of those bits being contained in and output by register 20-11, and the most recent of those bits being contained in and output by register 20-0.

Although 12 registers 20 are shown in FIG. 1, it will be understood that this is only illustrative and that any number of such registers can be provided as desired. Preferably, however, the number of registers provided is at least approximately equal to the number of bits in a byte. In many instances it is even more preferable to provide more registers 20 than there are bits in a byte (e.g., 50% more registers, 100% more registers, or even more registers). This may be desirable, for example, to facilitate channel-to-channel alignment where the amount of inter-channel skew may exceed the time required to serially transmit one byte.

The data output by each of registers 20 is applied to a respective one of the inputs to multiplexer ("mux") circuitry 30. Mux 30 is circuitry that can select any one of its input signals to be its output signal (applied to register or flip-flop 40). The selection made by mux 30 is controlled by the CNTL[3:0] outputs of counter 50. In the particular example shown in FIG. 1, mux 30 is a 12:1 mux because there are 12 registers 20. If a different number of registers 20 is provided, an appropriate, differently-sized mux 30 is used. Similarly, in the FIG. 1 example, counter 50 is a four-bit counter applying four selection control signals CNTL[3:0] to mux 30. This is sufficient to control a 1-of-12 selection (because a four-bit counter has 16 states (of which four are not used and can be skipped when controlling a 1-of-12 selection)). If a different number of registers 20 and a different size mux 30 were provided, it might be appropriate to use a different size counter 50 with a different number of mux control output signals CNTL. For example, if only eight registers 20 were provided, counter 50 could be a three-bit counter with three mux control output signals CNTL[2:0]. This would be sufficient to control an eight-input mux 30 to make a 1-of-8 selection. If more than 16 (but no more than 32) registers 20 were used, counter 50 could be a five-bit counter with five mux control output signals CNTL[4:0]. This would be sufficient to control an n-input mux 30 (where n is in the range from 17 to 32, inclusive) to make a 1-of-n selection.

Counter 50 is clocked by the FCLK signal. It is selectively enabled to count by the state of its BSLIPCNTL input signal. It can be reset to a desired starting count by assertion of its BSLIPRST input signal. It can be made to start its count again after reaching a predetermined ("limiting") count by assertion of its BSLIPMAX input signal. For example, if the circuitry has more registers 20 than the number of bits in a byte, but it is desired in a particular application not to let the number of bits slipped exceed one byte, assertion of the BSLIPMAX signal can be used to cause counter 50 to go back to a count of 0 after reaching a count of m−1 (where m is the number of bits in a byte).

The BSLIPCNTL control signal typically comes from the circuitry that is receiving the output of circuitry 10. This circuitry may include, for example, the capability of determining whether proper bytes are being received. If not, the BSLIPCNTL signal is periodically and briefly given the state that enables counter 50 to count one FCLK pulse, thereby changing the state of counter 50 by one count. This causes mux 30 to get its output signal from the output of the next register 20 in the chain of registers 20. (It is generally assumed herein that counter 50 increments, and that the "next register" 20 is the next higher-numbered register (e.g., if the output of register 20-6 was being selected by mux 30, incrementing counter 50 causes mux 30 to select the output of register 20-7). It will be understood, however, that this is only illustrative. For example, counter 50 could decrement instead, and mux 30 could instead move to the next lower numbered register 20 in response to each such counter 50 decrement.)

The BSLIPRST control signal also typically comes from the circuitry that is receiving the output of circuitry 10. However, examples of other possibilities include having the BSLIPRST signal come from a system reset, a subsystem reset, or the like.

The BSLIPMAX control signal may come from any suitable source, such as the circuitry that receives the output of circuitry 10. Alternatively, this control signal may come from a separately programmable source. As another alternative, instead of being one signal, BSLIPMAX may represent several signals that include signals indicative of the selectable maximum count beyond which counter 50 is not allowed to go in any particular application of the circuitry.

The output signal of mux 30 is applied to the data input terminal of register 40. Register 40 is also clocked by the FCLK signal. The output signal of flip-flop 40 is the DIN1 output signal circuitry 10. For example, the DIN1 signal may be the serial data input signal to deserializer circuitry in the circuitry that uses the output of circuitry 10. Because circuitry 10 performs the bit slipping necessary to achieve byte alignment and/or channel-to-channel alignment, the deserializer circuitry and/or circuitry downstream from the deserializer circuitry does not need to have that capability.

Although operation of circuitry 10 should already be apparent from the foregoing, it will nevertheless now be described briefly. This discussion will refer for the most part to byte alignment, but it will be readily apparent how similar operations support channel-to-channel alignment.

Incoming serial data DIN0 (e.g., from CDR circuitry (not shown)) is shifted into and along the chain of registers 20 in synchronism with and at the rate of serial bit rate clock FCLK. Assume that counter 50 starts with a count of zero. This causes mux 30 to apply the output signal of register 20-0 to register 40. DIN1 is therefore DIN0 delayed by two FCLK cycles (i.e., the delay of register 20-0 plus the delay of register 40).

If the circuitry receiving DIN1 does not find properly aligned bytes in that signal, that circuitry causes the BSLIPCNTL signal to enable counter 50 to count one FCLK pulse. This increments the count in counter 50 from zero to one, which in turn causes mux 30 to apply the output signal of register 20-1 to register 40. DIN1 is now DIN0 delayed by three FCLK cycles (i.e., the delays of registers 20-0, 20-1, and 40). In other words, DIN1 has slipped one more bit relative to DIN0 as compared to conditions when the count of counter 50 was zero.

If the circuitry receiving DIN1 still does not find satisfactorily aligned bytes in the DIN1 signal, that circuitry again causes BSLIPCNTL to enable counter 50 to count another FCLK signal pulse. This increments the contents of counter 50 from 1 to 2, thereby causing mux 30 to now apply the output of register 20-2 to register 40. DIN1 is now delayed four FCLK cycles relative to DIN0 (i.e., the delays of registers 20-0, 20-1, 20-2, and 40). Once again, DIN1 has slipped another bit relative to DIN0 as compared to conditions when the count in counter 50 was one.

The process described above continues until the circuitry receiving DIN1 begins to find satisfactorily aligned bytes in that signal. No further change in the counter 50 count is then necessary, and mux 30 will consequently continue to apply to register 40 whatever register 20 output caused the DIN1 data to be properly aligned. The DIN1 data will therefore continue to be properly aligned.

It will be understood that the foregoing is only illustrative of the principles of the invention, and that various modifications can be made by those skilled in the art without departing from the scope and spirit of the invention. For example, the word "byte" is used herein as a convenient term for any number of bits. Some examples of possible byte lengths are four bits, eight bits, ten bits, or 16 bits; but a byte can have any desired length. There is no special significance to the choice of the term "byte" for use herein, and other terms such as "nibble," "word," "string," or the like could have been used instead with no change in the intended scope of the disclosure.

An example of a possible circuit modification within the scope of the invention is elimination of register 40. Instead, the output of mux 30 could be fed directly into the first stage of the serial side of deserializer circuitry. Another example of a possible circuit modification is use of circuitry other than a counter 50 to control the selection made by mux 30. For example, state machine circuitry could be used instead of a counter, or other logic circuitry could be used instead of a counter. Mux 30 can be implemented (or its functions performed) in different ways. For example, instead of traditional multiplexer circuitry, the output of each shift register stage 20 could be applied to one input terminal of a respective two-input AND gate. The other input to each AND gate could be the output signal of a respective stage of a closed loop shift register, through which a single binary 1 is selectively recirculated (all other bits in the closed loop shift register being binary 0). In this way only one AND gate would be enabled at any time. The outputs of all of the AND gates would be connected together. The circuit would operate very much like traditional multiplexer circuitry. Many other circuit modifications will occur to those skilled in the art without departing from the scope and spirit of the invention.

What is claimed is:

1. Bit slip circuitry comprising:
    multistage shift register circuitry through which a serial data input signal is shifted; and
    selection circuitry for selecting a serial data output signal from among output signals of at least some stages of the shift register circuitry, wherein bits in the serial data input signal are organized in bytes of m successive bits, wherein m is an integer, and wherein the shift register circuitry includes at least approximately m stages.

2. The circuitry defined in claim 1 wherein the shift register circuitry shifts at a bit rate of the serial data input signal.

3. The apparatus defined in claim 1 wherein the selection circuitry comprises:
    multiplexer circuitry having a plurality of input terminals, to each of which is connected a respective one of the output signals of the at least some stages.

4. The apparatus defined in claim 1 wherein the multiplexer circuitry is controllable to select as the serial data output signal a signal applied to any one of its input terminals.

5. The circuitry defined in claim 1 wherein the shift register circuitry includes more than m stages.

6. The circuitry defined in claim 1 wherein the selection circuitry comprises:
    counter circuitry.

7. Bit slip circuitry comprising:
    multistage shift register circuitry through which a serial data input signal is shifted; and
    selection circuitry for selecting a serial data output signal from among output signals of at least some stages of the shift register circuitry, wherein the selection circuitry is adapted to selectively count pulses of a bit rate clock signal.

8. Bit slip circuitry comprising:
    multistage shift register circuitry through which a serial data input signal is shifted; and
    selection circuitry for selecting a serial data output signal from among output signals of at least some stages of the shift register circuitry, wherein the selection circuitry is adapted to selectively restart its count after reaching a maximum count.

9. The circuitry defined in claim 8 wherein the maximum count is controllably selectable.

10. A bit slipping method comprising:
    shifting a serial data input signal through a multistage shift register;
    applying output signals of at least some stages of the shift register circuitry to respective input terminals of selection circuitry; and
    controlling the selection circuitry to cause it to derive a serial data output signal from various ones of its input terminal signals at various times, wherein bits in the serial data input signal are organized in bytes of m successive bits, wherein m is an integer, and wherein the shift register circuitry includes at least approximately m stages.

11. The method defined in claim 10 wherein the controlling comprises:
    causing the selection circuitry to successively derive the serial data output signal from output signals of stages of the shift register circuitry in an order of the stages in the shift register circuitry.

12. The method defined in claim 10 wherein the shift register circuitry includes more than m stages.

13. Bit slip circuitry comprising:
    multistage shift register circuitry through which a serial data input signal is shifted at a bit rate of the serial data input signal; and
    selection circuitry for selecting from among output signals of each stage of the shift register circuitry a signal for use in providing a serial data output signal, wherein the selection circuitry is adapted to selectively count signal pulses that are at the bit rate of the serial data input signal.

14. The circuitry defined in claim 13 wherein the selection circuitry comprises:
    multiplexer circuitry having a plurality of input terminals, each of which is connected to receive the output signal of a respective one of the stages of the shift register circuitry.

15. The circuitry defined in claim 14 wherein the selection circuitry further comprises:
    control circuitry for selectively controlling the multiplexer circuitry to select for outputting the signal applied to different ones of its input terminals at different times.

16. The circuitry defined in claim 15 wherein the control circuitry comprises:
    counter circuitry.

17. Bit slip circuitry comprising:
    multistage shift register circuitry through which a serial data input signal is shifted at a bit rate of the serial data input signal; and
    selection circuitry for selecting from among output signals of each stage of the shift register circuitry a signal for use in providing a serial data output signal, wherein the selection circuitry is adapted to selectively restart its count after reaching a limiting count.

18. The circuitry defined in claim 17 wherein the limiting count is controllably selectable.

19. Bit slip circuitry comprising:
    multistage shift register circuitry through which a serial data input signal is shifted at a bit rate of the serial data input signal; and
    selection circuitry for selecting from among output signals of each stage of the shift register circuitry a signal for use in providing a serial data output signal, wherein bits in the serial data input signal are organized in bytes of m successive bits, wherein m is an integer, and wherein the shift register circuitry includes at least approximately m stages.

20. The circuitry defined in claim 19 wherein the shift register circuitry includes more than m stages.

21. Bit slip circuitry comprising:
multistage shift register circuitry through which a serial data input signal is shifted;
selection circuitry for selecting a serial data output signal from among output signals of at least some stages of the shift register circuitry; and
deserializer circuitry for receiving the selected serial data output signal and generating a parallel data output signal comprising a plurality of successive bits of the serial data output signal, wherein bits in the serial data input signal are organized in bytes of m successive bits, wherein m is an integer, and wherein the shift register circuitry includes at least approximately m stages.

22. The circuitry defined in claim 21 wherein the shift register circuitry shifts at a bit rate of the serial data input signal.

23. The apparatus defined in claim 21 wherein the selection circuitry comprises:
multiplexer circuitry having a plurality of input terminals, to each of which is connected a respective one of the output signals of the at least some stages.

24. The apparatus defined in claim 23 wherein the multiplexer circuitry is controllable to select as the serial data output signal a signal applied to any one of its input terminals.

25. The circuitry defined in claim 21 wherein the shift register circuitry includes more than m stages.

26. The circuitry defined in claim 21 wherein the selection circuitry comprises:
state machine circuitry.

27. The circuitry defined in claim 21 wherein the selection circuitry comprises:
counter circuitry.

28. Bit slip circuitry comprising:
multistage shift register circuitry through which a serial data input signal is shifted;
selection circuitry for selecting a serial data output signal from among output signals of at least some stages of the shift register circuitry; and
deserializer circuitry for receiving the selected serial data output signal and generating a parallel data output signal comprising a plurality of successive bits of the serial data output signal, wherein the selection circuitry is adapted to selectively count pulses of a bit rate clock signal.

29. Bit slip circuitry comprising:
multistage shift register circuitry through which a serial data input signal is shifted;
selection circuitry for selecting a serial data output signal from among output signals of at least some stages of the shift register circuitry; and
deserializer circuitry for receiving the selected serial data output signal and generating a parallel data output signal comprising a plurality of successive bits of the serial data output signal, wherein the selection circuitry is adapted to selectively restart its count after reaching a maximum count.

30. The circuitry defined in claim 29 wherein the maximum count is controllably selectable.

31. The circuitry defined in claim 29 wherein the maximum count is programmable.

32. Bit slip circuitry comprising:
multistage shift register circuitry through which a serial data input signal is shifted;
selection circuitry for selecting a serial data output signal from among output signals of at least some stages of the shift register circuitry, wherein:
the selection circuitry comprises control circuitry for controlling the selecting of the serial data output signal; and
operation of the control circuitry can be determined, at least in part, by a programmable signal, wherein bits in the serial data input signal are organized in bytes of m successive bits, wherein m is an integer, and wherein the shift register circuitry includes at least approximately m stages.

33. The circuitry defined in claim 32 wherein the shift register circuitry shifts at a bit rate of the serial data input signal.

34. The apparatus defined in claim 32 wherein the selection circuitry comprises:
multiplexer circuitry having a plurality of input terminals, to each of which is connected a respective one of the output signals of the at least some stages.

35. The apparatus defined in claim 34 wherein the multiplexer circuitry is controllable to select as the serial data output signal a signal applied to any one of its input terminals.

36. The circuitry defined in claim 32 wherein the shift register circuitry includes more than m stages.

37. The circuitry defined in claim 32 wherein the control circuitry comprises:
state machine circuitry.

38. The circuitry defined in claim 32 wherein the control circuitry comprises:
counter circuitry.

39. Bit slip circuitry comprising:
multistage shift register circuitry through which a serial data input signal is shifted;
selection circuitry for selecting a serial data output signal from among output signals of at least some stages of the shift register circuitry, wherein:
the selection circuitry comprises control circuitry for controlling the selecting of the serial data output signal; and
operation of the control circuitry can be determined, at least in part, by a programmable signal, wherein the control circuitry is adapted to selectively count pulses of a bit rate clock signal.

40. Bit slip circuitry comprising:
multistage shift register circuitry through which a serial data input signal is shifted;
selection circuitry for selecting a serial data output signal from among output signals of at least some stages of the shift register circuitry, wherein:
the selection circuitry comprises control circuitry for controlling the selecting of the serial data output signal; and
operation of the control circuitry can be determined, at least in part, by a programmable signal, wherein the control circuitry is adapted to selectively restart its count after reaching a maximum count.

41. The circuitry defined in claim 40 wherein the maximum count is controllably selectable.

42. The circuitry defined in claim 40 wherein the maximum count is programmable.

* * * * *